United States Patent [19]

Boler et al.

[11] Patent Number: 5,134,584
[45] Date of Patent: Jul. 28, 1992

[54] RECONFIGURABLE MEMORY

[75] Inventors: Clifford H. Boler, Bloomington; Jeffrey A. Lukanc, Eden Prairie, both of Minn.

[73] Assignee: VTC Incorporated, Bloomington, Minn.

[21] Appl. No.: 223,084

[22] Filed: Jul. 22, 1988

[51] Int. Cl.[5] .................... G11C 29/00; G11C 17/16
[52] U.S. Cl. .................... 365/200; 365/201; 365/225.6; 371/11.1; 371/21.1
[58] Field of Search .......... 365/225.7, 200, 201, 365/189.12, 230.08, 189.05; 371/11, 21

[56] References Cited

U.S. PATENT DOCUMENTS

| | | | |
|---|---|---|---|
| 4,228,528 | 10/1980 | Cenker et al. | 365/200 |
| 4,322,635 | 3/1982 | Redwine et al. | 365/189.12 X |
| 4,330,852 | 5/1982 | Redwine et al. | 365/240 X |
| 4,566,102 | 1/1986 | Hefner | 371/11 |
| 4,598,388 | 7/1986 | Anderson | 365/200 |
| 4,601,019 | 7/1986 | Shah | 365/200 |
| 4,604,730 | 8/1986 | Yoshida et al. | 365/200 |
| 4,654,830 | 3/1987 | Chua et al. | 365/200 |
| 4,660,179 | 4/1987 | Aoyama | 365/200 |
| 4,689,494 | 8/1987 | Chen et al. | 365/200 X |
| 4,691,301 | 9/1987 | Anderson | 365/225.7 X |
| 4,714,839 | 12/1987 | Chung | 365/200 |

Primary Examiner—Alyssa H. Bowler
Attorney, Agent, or Firm—Kinney & Lange

[57] ABSTRACT

A configurable device uses a plurality of parallel units which are made up of cells for storing individual bits of information. These cells are identified by address signals and selected to be interrogated. The selected cells are interrogated to determine information stored therein and a signal is produced which corresponds to that information. If a nonfunctional cell is detected within a parallel unit, that parallel unit may be decoupled from the interrogator. The remainder of the parallel units are shifted to different interrogators thereby effectively eliminating use of the decoupled parallel unit which contains the nonfunctional cell.

17 Claims, 5 Drawing Sheets

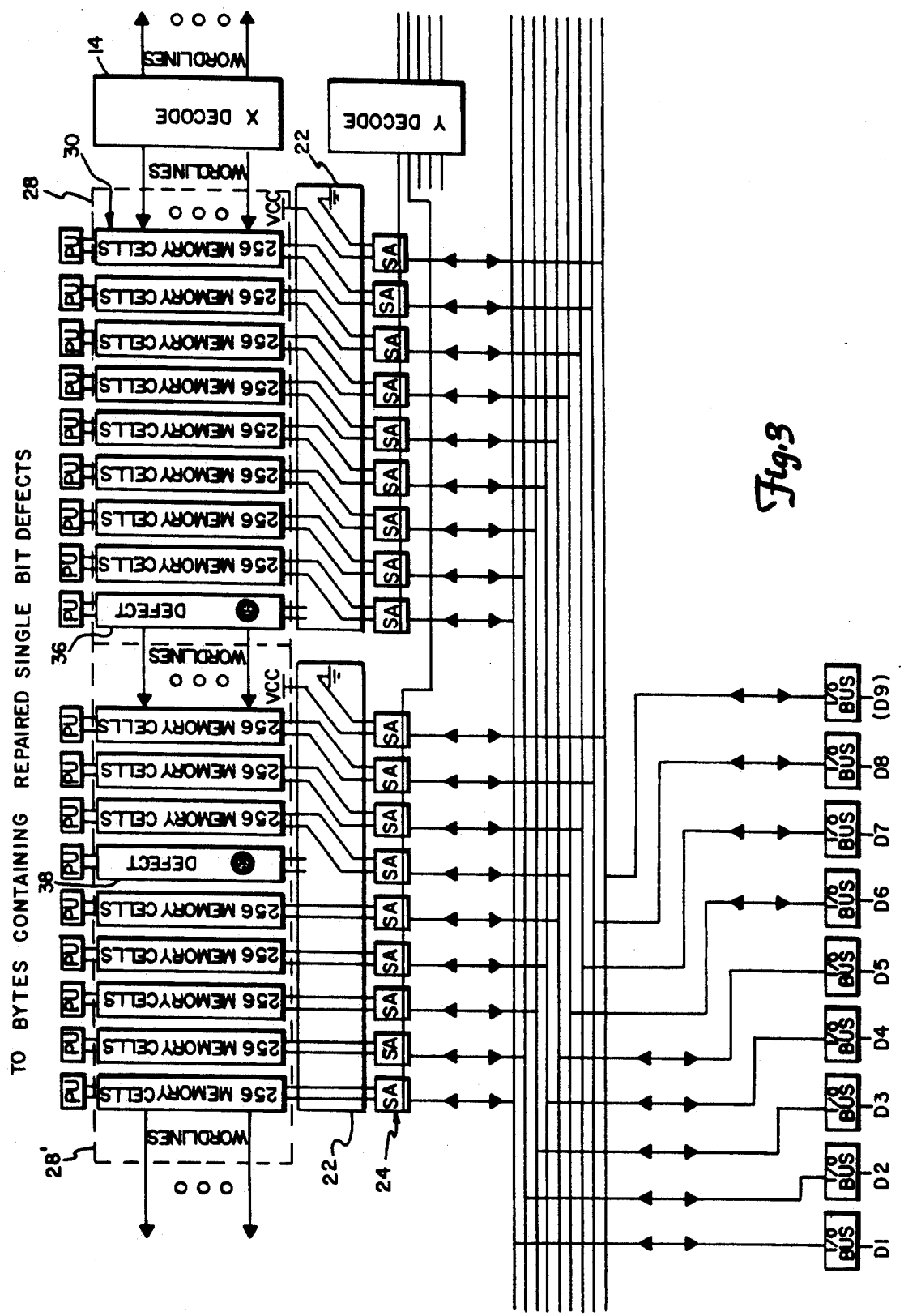

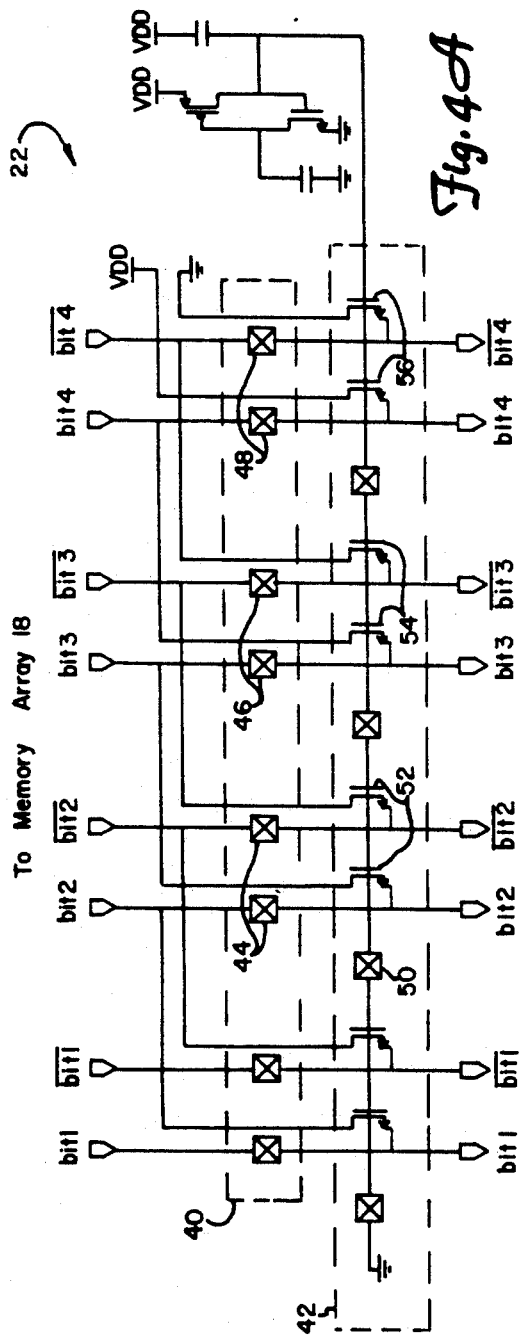
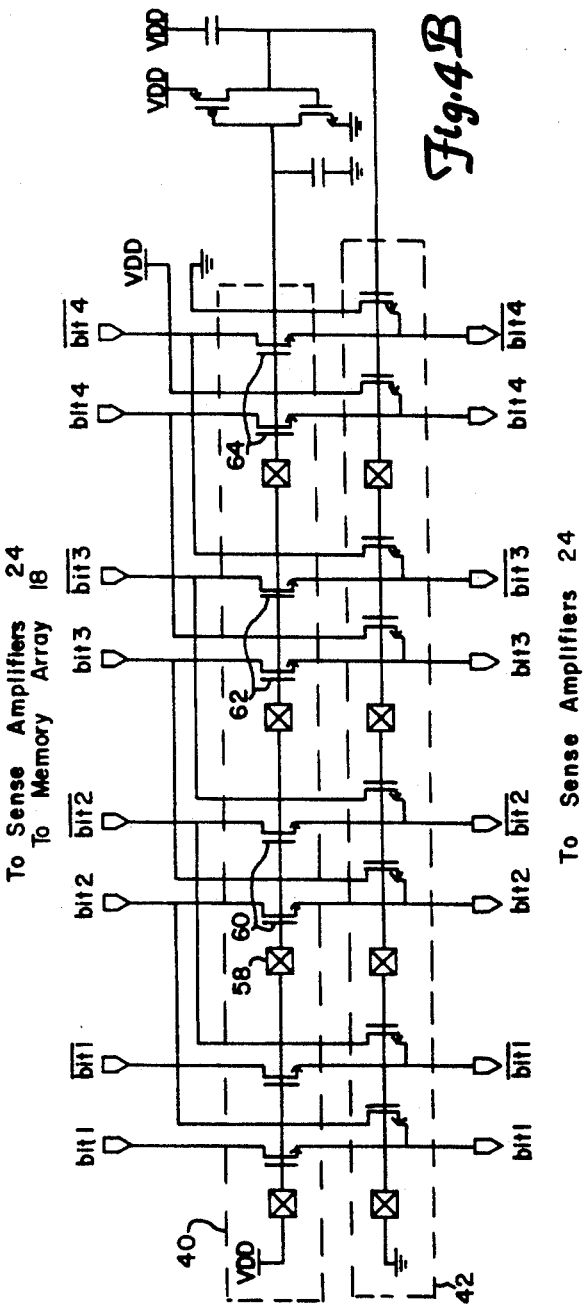
Fig. 4A
Fig. 4B

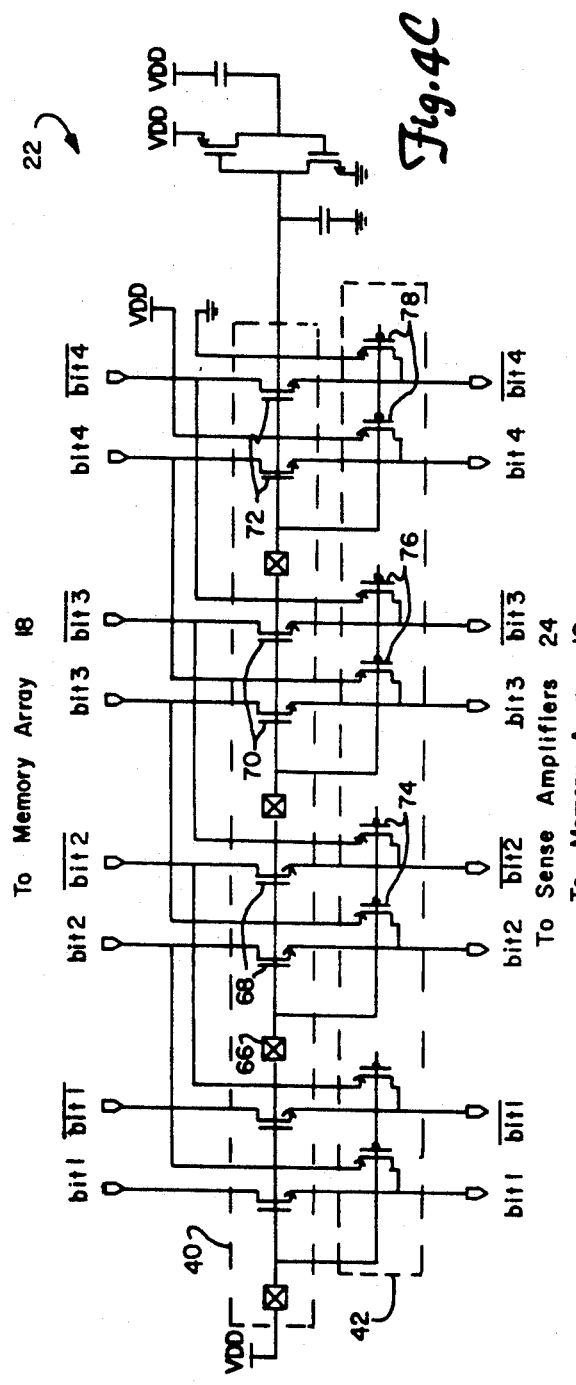
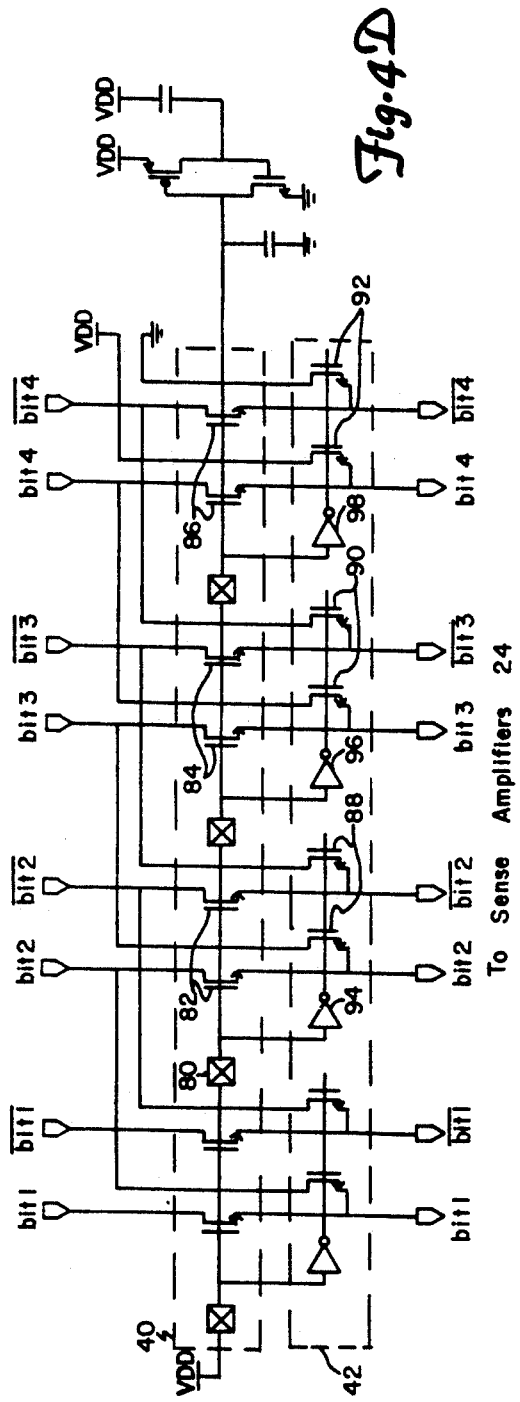

RECONFIGURABLE MEMORY

BACKGROUND OF THE INVENTION

1. Field of the Invention

The present invention relates to reconfigurable parallel units which store information. More particularly, the invention relates to providing reconfigurable memory devices which improve yields throughout production.

2. Description of the Prior Art

As integrated circuit memories become larger and more complex, it becomes increasingly difficult to fabricate a memory which is one hundred percent functional. It is a constant goal to increase production yield. One technique utilized to increase production yield is to provide redundant circuits in the memory to allow for replacement of defective portions of the memory. See, for example, the Hefner U.S. Pat. No. 4,566,102.

During device testing, the defective portion is identified and replaced with a redundant circuit through reconfiguration of the memory. The memory is reconfigured by opening specified fuses corresponding to the redundant portion of the memory thereby replacing the defective portion.

References which disclose this type of memory redundancy are Chen et al U.S. Pat. No. 4,689,494, Chua et al U.S. Pat. No. 4,654,830, Yoshida et al U.S. Pat. No. 4,604,730, Shah et al U.S. Pat. No. 4,601,019, Anderson U.S. Pat. No. 4,598,388, Cenker et al U.S. Pat. No. 4,228,528, and Chen et al U.S. Pat. No. 4,689,494.

Generally, of the above cited references, a redundant memory block is hidden from the user. During production, the original memory configuration is tested. If a defect is found in a portion of the memory, the hidden memory block is substituted for the defective portion. The memory must then be retested and if a failure is now found in the substituted column, the repair attempt will have been unsuccessful.

The problem with the above mentioned approach is that all repair attempts cannot be guaranteed to be successful because the hidden columns or rows are not tested for functionality or access time prior to the repair attempt. This translates into extra prober, laser trimmer, test time, and wafer handling to be expended to attempt to repair the die which cannot be guaranteed to work. Additionally, the overall access time of the device may be increased, in the above approach, due to added capacitance from comparators which are required to determine which column is to be replaced by the redundant column. The extra circuitry to perform the column compare and switch in the redundant memory cells is also subject to defects which decrease the yield of the device.

Many of the above cited references also have an increase in AC and DC supply current after the redundant memory cells are activated. Also, utilizing the above approach, the die with no defects cannot utilize all the memory cells that are in the design. This translates into increased cost due to the unused circuitry.

SUMMARY OF THE INVENTION

The present invention is a configurable device with a plurality of parallel units for storing multiple bits of information wherein each parallel unit includes at least one cell for storing a single bit of information. The configurable device includes a selecting means for selecting cells to be interrogated wherein the cells are identified by predetermined address signals and wherein one cell is identified in each parallel unit. Interrogating means are also included for interrogating selected cells to determine the information stored therein, and for producing a signal corresponding to the information stored therein where the interrogating means are coupled to outputs of the parallel units. Finally, configuring means are included for reconfiguring the configurable device.

The configuring means consists of decoupling means and shifting means. The decoupling means are utilized for decoupling the outputs of the parallel units from the interrogating means upon detection of at least one nonfunctional cell within the parallel unit. Additionally, shifting means are utilized for shifting the outputs of the parallel units to different interrogating means upon decoupling of a parallel unit, thereby effectively eliminating use of the decoupled parallel unit which contains the nonfunctional cell.

This invention allows for one hundred percent utilization of the parallel units when no defects are found. Upon the detection of a defect, however, the parallel unit containing the defective cell is eliminated from use and the remaining parallel units are realigned or shifted so that the configurable device becomes one contiguous block of memory which is different in size from that of the original configurable device.

For example, an 8K×9 static random access memory (SRAM) may be fabricated. When a defect is detected, the SRAM may be reconfigured to produce an 8K×8 SRAM. This enables multiple SRAM products to be fabricated from a common set of underlayers.

BRIEF DESCRIPTION OF THE DRAWINGS

FIG. 3 shows a defective 8K×9 SRAM which has been reconfigured and converted to an 8K×8 SRAM.

FIG. 4A shows one embodiment of the circuitry used to accomplish reconfiguration.

FIG. 4B shows a second embodiment of the circuitry used to accomplish reconfiguration.

FIG. 4C shows a third embodiment of the circuitry used to accomplish reconfiguration.

FIG. 4D shows a fourth embodiment of the circuitry used to accomplish reconfiguration.

DETAILED DESCRIPTION OF THE PREFERRED EMBODIMENTS

Figure 1:
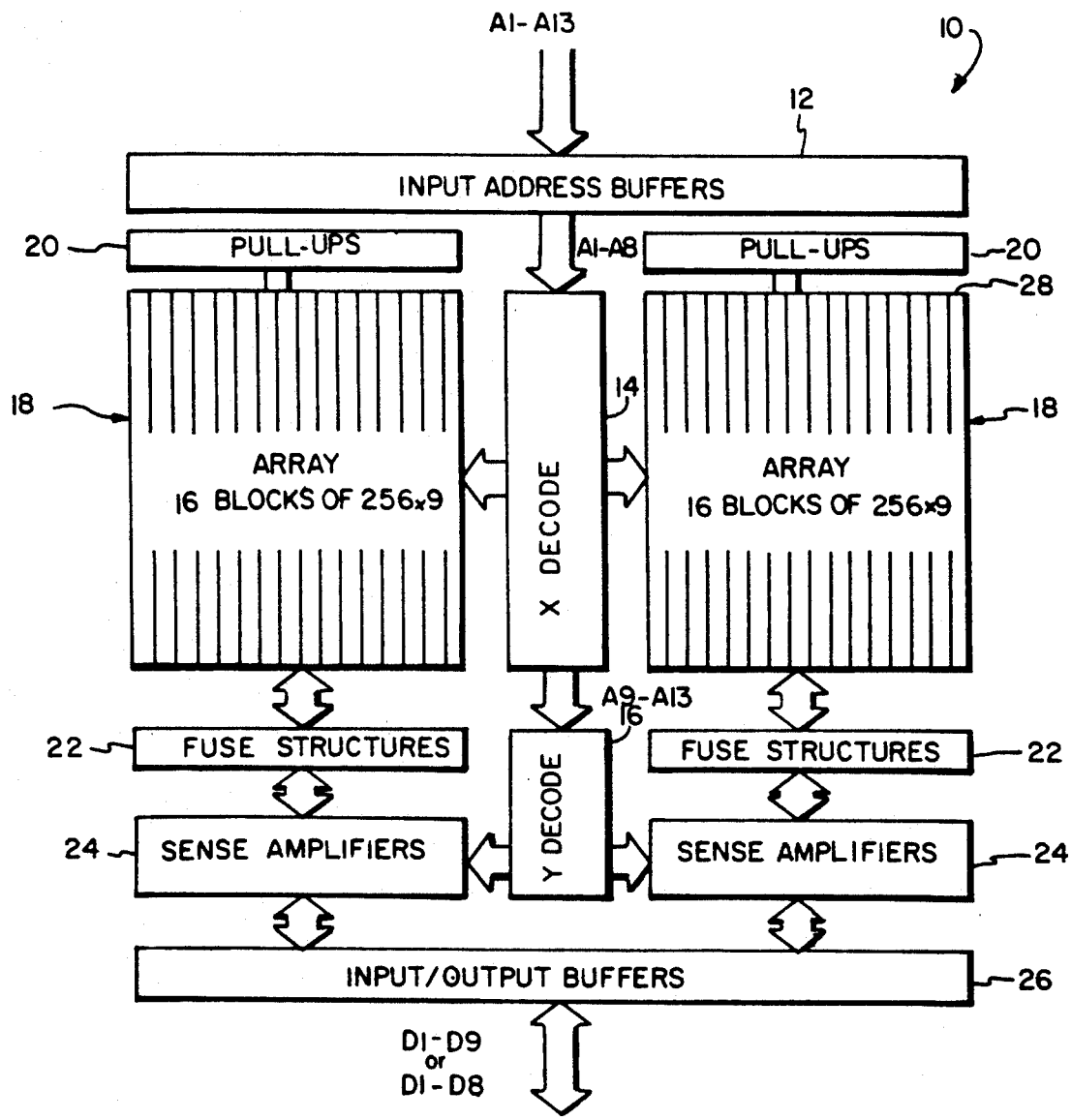
FIG. 1 shows a simplified block diagram of an 8K×9 static random access memory (SRAM).

FIG. 1 is a block diagram showing a preferred embodiment of the present invention a configurable 8K×9 static random access memory (SRAM) 10. In this embodiment, SRAM 10 includes input address buffers 12, X decode circuitry 14, Y decode circuitry 16, a pair of memory arrays 18, pull-up circuitry 20, fuse structures 22, sense amplifiers 24, and input/output (I/O) buffers 26. Each memory array 18 includes sixteen memory blocks 28 each containing 256×9 memory cells.

Address lines A1-A13 provide a thirteen bit address to input address buffers 12. The first eight address bits (from lines A1-A8) represent the X address, and are used to select one of the memory rows for reading or writing The remaining five bits (from lines A9-A13) represent the Y address, and select the appropriate bank of memory columns and the corresponding sense amplifiers 24. X decode circuit 14 and Y decode circuit 16 decode the address received on lines A1-A13 and enable a byte of nine (or eight) bits of memory to be selected depending on the particular binary address which is supplied. During a read operation, those nine (or eight) bits are interrogated for a logical "1" or "0" by the sense amplifiers 24, and the outputs of the sense amplifiers are provided to I/O buffers 26. The nine-bit output is supplied by I/O buffers 26 on data lines D1-D9. If SRAM 10 has been reconfigured to an 8K×8 device (due to defective memory cells within memory blocks 28) the eight-bit byte is supplied by I/O buffers 26 on data lines D1-D8. Similarly, during a write operation the nine (or eight) bits of memory receive and store a nine (or eight) bit word received from I/O buffers 26.

Figures 2, 2A:
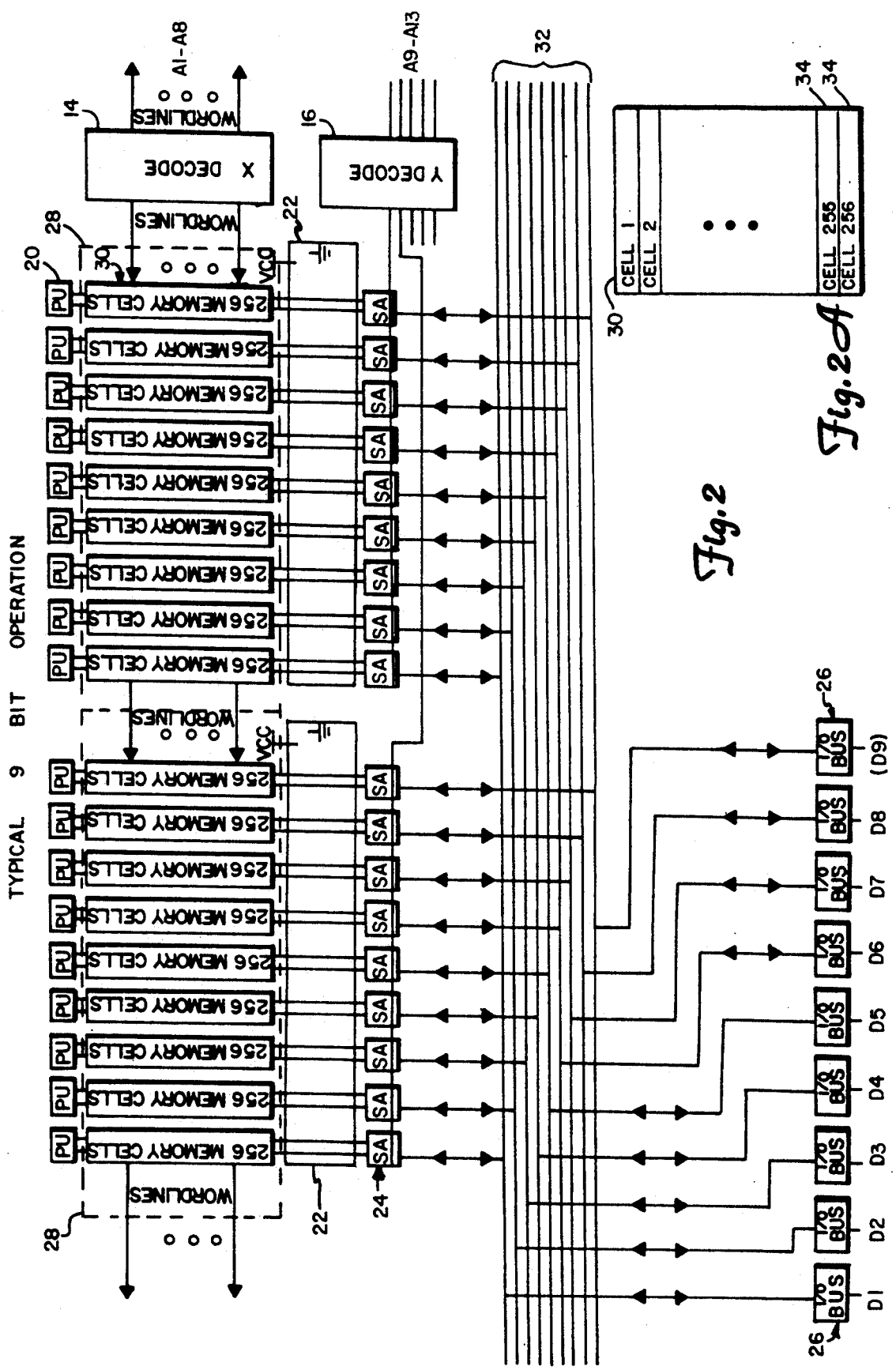
FIG. 2 is a block diagram of two 256×9 memory blocks with associated circuitry, which shows the data flow of two nine-bit bytes of memory in the 8K×9 SRAM of FIG. 1.
FIG. 2A is a block diagram which shows a more detailed depiction of a single parallel unit (column) of one of the memory blocks of FIG. 2 broken up into individual memory cells.

FIG. 2 is a block diagram of two 256×9 memory blocks 28 and 28'. Address lines A1-A8 apply the first eight address signals to X decode circuitry 14. X decode circuitry 14 applies select signals to memory blocks 28 and 28', and particularly to columns of memory cells 30. The select signals from X decode circuitry 14 select one nine-bit (or eight-bit) byte of information from each memory block 28 and 28' for a read or write operation. The nine bit (or eight-bit) byte of information is made up of one cell from each of the nine columns of memory cells 30 in memory blocks 28 and 28'. The bit and $\overline{\text{bit}}$ lines of the columns of memory cells 30 are connected to the sense amplifiers 24 through the fuse structures 22. During a read operation, the sense amplifiers 24 detect a logical "1" or "0" stored in the selected cells of columns of memory cells 30 which make up the nine bit (or eight-bit) byte of information from memory blocks 28 or 28'. During a write operation, the bits to be written flow from I/O buffers 26 to data bus 32 and through the sense amplifiers 24 to the desired bit and $\overline{\text{bit}}$ lines.

The last five address bits are applied to Y decode circuitry 16 on lines A9-A13. Y decode circuitry 16 provides select signals to the sense amplifiers 24 associated with memory blocks 28 and 28'. When a set of sense amplifiers is selected, the information derived from the corresponding nine bit (or eight-bit) byte of information (logical 1's or 0's) is supplied to data bus 32 from sense amplifiers 24, or vice versa. During a read operation, data bus 32 applies the information derived from sense amplifiers 24 to I/O buffers 26. The nine-bit (or eight-bit) output is supplied by I/O buffers 26 on data lines D1-D9. During a write operation, data flows in the opposite direction from data lines D1-D9 to memory blocks 28, 28'.

FIG. 2A is a block diagram which shows a more detailed depiction of a single column of memory cells 30 corresponding to one of the memory blocks 28 or 28' shown in FIG. 2. The column of memory cells 30 is broken up into individual cells 34 each of which stores a single bit of information (a logical 1 or 0).

FIG. 3 shows a block diagram of a defective 8K×9 SRAM which has been reconfigured to form an 8K×8 SRAM. In this block diagram, defective memory cells were found, through testing, in columns of memory cells 36 and 38; therefore, columns of memory cells 36 and 38 must be made effectively invisible to the user during operation of SRAM 10. This is accomplished by reconfiguring the outputs of the remaining columns of memory cells 30 through fuse structures 22. As shown, the bit and $\overline{\text{bit}}$ lines of defective columns 36 and 38 of memory cells are effectively decoupled from their corresponding sense amplifiers 24. Also, the outputs of the columns of memory cells 30 located to the right of defective columns 36 and 38, in memory blocks 28 and 28' respectively, are effectively shifted to the left one place along sense amplifiers 24. The output of the sense amplifier located on the far right of each memory block 28 and 28', respectively, becomes fixed in a known state. Hence, data bus 32 effectively becomes an eight bit data bus and data line D9 becomes unused.

Shifting the outputs of columns of memory cells 30 does not change the operation of SRAM with respect to data flow during reading and writing. However, only an eight bit byte of information is read from or written to each block of memory. Therefore, SRAM 10 has now been reconfigured to function as an 8K×8 SRAM.

FIG. 4A shows one embodiment of fuse structures 22 used to accomplish reconfiguration. In this embodiment, fuse structures 22 are made up of a decoupling means 40 and a shifting means 42. When a defective cell is found, the decoupling means is used to decouple the column of memory cells containing the defective cell and the shifting means is used to shift the outputs of the remaining columns of memory cells, which lie to the right of the defective column, to the left one place along sense amplifiers 24. For example, if bit two corresponds to the column of memory cells containing the defective cell, fuses 44, 46 and 48 would be blown using a laser means (not shown) breaking the connection of the bit and bit lines of the column of memory cells associated with bits two, three and four from the sense amplifiers. Shifting means 42 then operates to shift the bit and bit lines of columns of memory cells associated with bits three and four to the left one place. This is done by blowing fuse 50 with a laser means resulting in the switching on of shifting transistors 52, 54 and 56. With these transistors conducting, bits three and four are effectively shifted to the left one place along sense amplifiers 24, and the lines located on the far right of fuse structures 22 become fixed in a known state.

FIG. 4B shows a second embodiment of fuse structures 22 used to accomplish reconfiguration. Similar to that shown in FIG. 4A, this embodiment is comprised of decoupling means 40 and shifting means 42. If, as in the example discussed above, bit two is associated with the defective column of memory cells, fuse 58 is blown using laser means, resulting in the switching off of decoupling transistors 60, 62 and 64. With the decoupling transistors in the nonconducting state, bits two, three and four are effectively decoupled from the sense amplifiers 24. Shifting means 42 functions the same as that shown in FIG. 4A and results in reconfiguration of SRAM 10 into an 8K×8 part.

FIG. 4C shows another embodiment of fuse structures 22 used to accomplish reconfiguration of SRAM 10. Once again, the fuse structures 22 consist of decoupling means 40 and shifting means 42. Decoupling means 40 operates the same as that shown in FIG. 4B. Shifting means 42, however, is comprised of transistors which are opposite in conductivity to those shown in FIG. 4B. Therefore, if, as in the example discussed above, bit two is associated with the column of memory cells containing the defective cell, fuse 66 is blown using laser means. In this embodiment, blowing fuse 66 operates to both switch off decoupling transistors 68, 70 and 72, and to switch on shifting transistors 74, 76 and 78. Therefore, by blowing fuse 66, bits two, three and four are effectively decoupled from sense amplifiers 24 and shifted to the left one place along sense amplifiers 24. Hence, reconfiguration of SRAM 10 into an 8K×8 part is accomplished.

FIG. 4D shows another embodiment of fuse structures 22 used to accomplish reconfiguration of SRAM 10. Again, fuse structures 22 are comprised of decoupling means 40 and shifting means 42. Decoupling means 40, in this embodiment, operates the same as that discussed in FIGS. 4B and 4C above. Shifting means 42 is comprised of shifting transistors, which are of the same conductivity as those in decoupling means 40, and inverters. Therefore, if, as discussed above, bit two is associated with the column of memory cells containing the defective cell, fuse 80 is blown resulting in switching off of decoupling transistors 82, 84 and 86. Additionally, blowing fuse 80 results in the application of a voltage on the gates of shifting transistors 88, 90 and 92 which turns them on. This voltage is applied from inverters 94, 96 and 98, respectively. With decoupling transistors 82, 84 and 86 in the nonconducting state, and shifting transistors 88, 90 and 92 in the conducting state, bits two, three and four are effectively decoupled from the sense amplifiers and bits three and four are shifted to the left one place. Therefore, reconfiguration of SRAM 10 into an 8K×8 part is accomplished.

As is apparent from the above description, switching of the shifting and decoupling transistors is controlled by using a laser means to blow certain fuses which connect the gates of the shifting and decoupling transistors to voltage supplies. However, workers skilled in the art will recognize this as only one of many obvious control means for selectively switching the decoupling and shifting transistors.

The redundancy scheme of the present invention allows production of a single device which is capable of utilizing 100% of the memory cells located thereon when no defects are detected. However, if a defect is detected, the product can be reconfigured, thereby eliminating the defect, and sold as a second product. Additionally, the redundancy achieved by the present scheme is very high, and the power dissipation of the device does not increase after it has been repaired. Also, since a single column is deactivated upon error detection and the remaining columns are shifted, no additional active circuitry is required.

For these reasons, the present invention allows one hundred percent of the memory to be tested for access time and functionality under various test patterns thereby allowing the fix-to-attempt ratio for the present design to be nearly 100%. This translates into less extra prober, laser trimmer, test time, and wafer handling to be expended on the device and results in a device which can be nearly guaranteed to work upon repair.

Although the present invention has been described with reference to preferred embodiments, workers skilled in the art will recognize that changes may be made in form and detail without departing from the spirit and scope of the invention.

What is claimed is:

1. A configurable device which includes:
   a plurality of parallel units for storing information wherein each parallel unit includes a plurality of cells for storing bits of information;
   selecting means for selecting cells to be interrogated wherein the cells are identified by predetermined address signals and wherein one cell is identified in each parallel unit;
   interrogating means for interrogating selected cells to determine the information stored therein, and for producing a signal corresponding to the information stored therein, where the interrogating means are coupled to outputs of the parallel units; and
   configuring means connected between the parallel units and the interrogating means, for configuring the configurable device including:
      decoupling means for selectively decoupling from the interrogating means the outputs of those parallel units containing at least one nonfunctional cell; and
      shifting means, connected between the parallel units and the interrogating means, for shifting from a first parallel state to a second parallel state the outputs of those parallel units containing all functional cell to different interrogating means upon decoupling of those parallel units containing at least one nonfunctional cell, thereby effectively eliminating use of those parallel units which contain nonfunctional cells.

2. The configurable device of claim 1 wherein the configurable device is a semiconductor memory device.

3. The semiconductor memory device of claim 2 wherein the cells form a memory matrix which comprises:
   columns formed by the cells being arranged in the parallel units and wherein the parallel units are grouped to form parallel bytes, each column corresponding to an X coordinate; and
   rows formed by the arrangement of the parallel bytes, each row corresponding to a Y coordinate.

4. The semiconductor memory device of claim 3 wherein the selecting means further includes:
   X decoder means for identifying cells corresponding to the X coordinate, the X coordinate being represented by a first portion of the predetermined address signals; and
   Y decoder means for identifying cells corresponding to the Y coordinate, the Y coordinate being represented by a second portion of the predetermined address signals.

5. The semiconductor memory device of claim 2 and further including:
   input address buffers connected to the selecting means for buffering the predetermined address signals.

6. The semiconductor memory device of claim 2 and further including:
   buffer means connected to the interrogating means for buffering the signals corresponding to the information stored in the selected cells.

7. The semiconductor memory device of claim 2 wherein the interrogating means includes a sense amplifier.

8. The configurable device of claim 1 wherein the decoupling means includes:
   fuses which directly couple the outputs of the parallel unit to the interrogating means.

9. The configurable device of claim 1 wherein the decoupling means includes decoupling transistors which couple the outputs of the parallel units to the interrogating means.

10. The configurable device of claim 9 and further including:

decoupling control means for selectively switching the decoupling transistors to effectively decouple the outputs of the parallel unit from the interrogating means.

11. The configurable device of claim 1 wherein the shifting means further includes:

shifting transistors which couple the outputs of the parallel units to adjacent interrogating means.

12. The shifting means of claim 11 and further including:

shifting control means for selectively switching the shifting transistors to effectively shift the outputs of a parallel unit to an adjacent interrogating means.

13. A configurable memory comprising:

a plurality of memory blocks each block containing memory cells arranged in N rows by M columns;

address means connected to the memory blocks for selectively addressing rows of memory cells of the blocks;

read means for reading data from an addressed row; and configuring means connected between the blocks and the read means for providing to the read means an M bit byte from an addressed row when all memory cells are functional, and providing an M−1 bit byte for an addressed row when one column of at least one block contains a defective memory cell, the configuring means comprising:

decoupling means connected to outputs of the columns for decoupling the outputs of the columns containing a defective memory cell from the read means; and shifting means, coupled between the memory blocks and the read means, for simultaneously shifting over by one bit in the M−1 bit byte the outputs of the columns on one side of the column whose output is decoupled.

14. The memory of claim 13 and further comprising:

write means for writing data to an addressed row, the write means being connected to the blocks through the configuring means.

15. A memory device which is configurable as either an M-bit byte of a (M−1)-bit byte device, the memory device comprising:

a plurality of address terminals for receiving address signals;

a plurality of memory blocks, each memory block containing memory cells arranged as N rows and M columns;

addressing means connected to the address terminals and the memory blocks for addressing bytes of information stored in the memory blocks based on the address signals;

M data output lines for providing data output from the M columns; and means, connected to the data output lines from the M columns in the memory blocks, for connecting M columns of each block to the M data output lines if all memory cells are functional, so that the device operates as an M-bit byte device; and for simultaneously connecting only M−1 columns of each block to M−1 of the M data output lines if any one column contains a defective memory cell.

16. The memory device of claim 15 wherein the means for connecting comprises:

decoupling means for selectively decoupling, in each block, one of the columns from the data lines; and shifting means for shifting over by one bit position the connection of each column on one side of the column which has been decoupled so that for each block the M−1 columns of that block which are remaining after one column has been decoupled are connected to the M−1 data lines.

17. A method of fabricating memory devices comprising:

forming a memory device with a plurality of blocks, each block containing memory cells arranged as N rows of M columns, each of the columns being connected through a reconfigurable circuit to data output terminals, the reconfigurable circuit being connected between the columns and the output terminals;

testing the memory device to determine if any columns contain defective memory cells;

if at least one block contains a column containing a defective memory cell, decoupling one of the columns from each block from the data output terminals by altering the reconfigurable circuit to produce a fully functional memory device with a reduced number of bits per byte.

* * * * *

UNITED STATES PATENT AND TRADEMARK OFFICE
CERTIFICATE OF CORRECTION

PATENT NO. : 5,134,584
DATED : July 28, 1992
INVENTOR(S) : CLIFFORD H. BOLER, JEFFREY A. LUKANC It is certified that error appears in the above-identified patent and that said Letters Patent is hereby corrected as shown below:

Col. 6, line 9, delete "configuring", insert "reconfiguring"

Col. 7, line 46, delete "of", insert "or"

Signed and Sealed this

Thirty-first Day of August, 1993

Attest:

BRUCE LEHMAN

*Attesting Officer*        Commissioner of Patents and Trademarks